United States Patent [19]

Lee

[11] Patent Number: 5,557,131
[45] Date of Patent: Sep. 17, 1996

[54] ELEVATED EMITTER FOR DOUBLE POLY BICMOS DEVICES

[75] Inventor: Steven Lee, Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 275,094

[22] Filed: Jul. 14, 1994

Related U.S. Application Data

[63] Continuation of Ser. No. 962,543, Oct. 19, 1992, abandoned.

[51] Int. Cl.$^6$ .......................... H01L 29/76; H01L 21/265
[52] U.S. Cl. .......................... 257/370; 257/377; 257/466; 257/571; 257/580; 257/586; 257/588; 257/592; 257/656; 257/754; 437/33; 437/34; 437/63; 437/105; 437/174; 437/186; 437/203
[58] Field of Search ................................... 257/370, 377, 257/586, 466, 571, 580, 588, 592, 656, 754; 437/31, 33, 34, 63, 105, 174, 186, 203

[56] References Cited

U.S. PATENT DOCUMENTS

| | | | |
|---|---|---|---|
| 4,157,269 | 6/1979 | Ning et al. . | |
| 4,319,932 | 3/1982 | Jambotkar . | |
| 4,483,726 | 11/1984 | Isaac et al. . | |
| 4,516,316 | 5/1985 | Haskell . | |
| 4,528,047 | 7/1985 | Beyer et al. . | |
| 4,641,416 | 2/1987 | Iranmanesh et al. . | |
| 4,740,478 | 4/1988 | Zdebel et al. . | |
| 4,746,623 | 5/1988 | Lane . | |
| 4,800,171 | 10/1989 | Iranmanesh et al. | 437/31 |
| 4,818,720 | 4/1989 | Iwasaki | 437/58 |
| 4,868,135 | 9/1989 | Ogura et al. | 437/31 |
| 4,897,703 | 1/1990 | Spratt et al. | 357/34 |
| 4,903,104 | 2/1990 | Kawai et al. . | |
| 4,929,570 | 5/1990 | Howell | 437/89 |
| 4,945,394 | 7/1990 | Palmour et al. | 257/586 |
| 4,960,726 | 10/1990 | Lechaton et al. | 437/59 |
| 4,965,216 | 10/1990 | Scovell et al. | 437/31 |
| 4,994,400 | 2/1991 | Yamaguchi et al. . | |
| 5,001,081 | 3/1991 | Tuntasood et al. | 437/59 |
| 5,006,476 | 4/1991 | De Jong et al. | 437/31 |
| 5,017,990 | 5/1991 | Chen et al. | 257/586 |
| 5,045,494 | 9/1991 | Choi et al. . | |
| 5,047,357 | 9/1991 | Eklund | 437/31 |
| 5,059,544 | 10/1991 | Burghartz et al. . | |
| 5,073,516 | 12/1991 | Moslehi . | |
| 5,089,430 | 2/1992 | Owada et al. . | |
| 5,096,844 | 3/1992 | Knig et al. . | |
| 5,101,256 | 3/1992 | Harame et al. . | |
| 5,118,634 | 6/1992 | Neudeck et al. . | |
| 5,121,184 | 6/1992 | Huang et al. . | |
| 5,124,276 | 6/1992 | Samata et al. . | |
| 5,132,765 | 7/1992 | Blouse et al. . | |
| 5,134,454 | 7/1992 | Neudeck et al. . | |

OTHER PUBLICATIONS

Silicon Processing for the VLSI Era, vol. 2: Process Integration; Stanley Wolf; 1990; p. 65.

High–Speed BiCMOS Technology with a Buried Twin Well Structure; Takahide Ikeda et al.; IEEE Transactions on Electron Devices, vol. Ed–34, No. 6, Jun. 1987; pp. 1304–1310.

BiCMOS Memories: Increasing Speed While Minimizing Process Complexity; Craig Lage; Solid State Technology, Aug. 1992; pp. 31–34.

Process Integration Issues for Submicron BiCMOS Technology; Robert H. Havemann et al.; Solid State Technology Jun. 1992; pp. 71–76.

Perspective on BiCMOS VLSI's; Masaharu Kubo et al.; Journal of Solid–State Circuits, vol. 23, No. 1 Feb. 1988; pp. 5–11.

*Primary Examiner*—Edward Wojciechowicz
*Attorney, Agent, or Firm*—Wayne P. Bailey; Douglas S. Foote

[57] ABSTRACT

A monolithic semiconductor device includes a field effect transistor and a bipolar junction transistor with an elevated emitter structure. An elevation structure raises the BJT emitter above the plane of the base. The elevation structure increases travel distance between a heavily doped base contact region and the emitter and protects against encroachment without increasing the total surface area allocated to the BJT device. A spacer oxide separates the polysilicon base contact and the elevation structure.

31 Claims, 8 Drawing Sheets

ELEVATED EMITTER FOR DOUBLE POLY BICMOS DEVICES

This is continuation of application Ser. No. 07/962,543 filed on Oct. 19, 1992 now abandoned.

BACKGROUND

The present invention relates to semiconductor processing and, in particular, to a process for forming a bipolar junction transistor emitter structure in BiCMOS (Bipolar junction and Complementary Metal Oxide Silicon) integrated circuits.

Although the original development of the monolithic integrated circuit ("IC") was based upon bipolar junction transistor ("BJT") technology, much of the recent work has focussed on very large scale integrated ("VLSI") circuits that utilize metal-oxide-silicon field effect ("MOSFET") transistors. MOSFET devices may be constructed with n-channel transistors ("CMOS"), p-channel transistors ("PMOS") or may cosine both n-channel and p-channel transistors in a complementary design ("CMOS").

The MOSFET devices, with their generally lower power dissipation and greater circuit densities, have come to dominate the logic and memory portions of the semiconductor market. Bipolar devices, however, have continued to be preferred in certain applications that require linear amplification of analog signals or maximum high frequency performance.

As can be appreciated, the limitations inherent in restricting a product to either MOSFET or BJT technologies at times forced circuit and device designers to compromise device or system performance. Thus, for some applications, the design requirements could best be met by combining both CMOS and BJT technologies in the same monolithic structure ("BiCMOS").

The need for a combination of both CMOS and BJT technologies has led to the development of a series of hybrid process flows that can produce the desired monolithic structure. However, in order to encompass production of the various elements of both CMOS and BJT structures, the first processes were more complex and demanding and frequently achieved lower circuit densities than either technology singly. Subsequent efforts in the BiCMOS process field have sought to reduce the complexity and/or improve the performance of first processes through elimination of masking levels, utilization of common elements, and other processing modifications.

It is known that the use of polysilicon emitter structures can improve device performance by reducing base saturation currents, $j_{Dsat}$, and increasing the device gain, $h_{fe}$. As device sizing decreases however, encroachment from the extrinsic base regions limit the effective area available for collector current injection. Extrinsic base region encroachment can offset the benefits associated with polysilicon emitters by reducing the current gain, lowering the cutoff frequency, and degrading device reliability.

An objective of the present invention is the production of an improved bipolar junction structure by effecting, through the disclosed method, an increased physical separation of the oppositely doped regions present in the structure without requiring a corresponding increase in the device surface area.

A further object of the present invention is the use of the improved bipolar junction structure as an emitter structure in the production of an improved bipolar junction transistor exhibiting desirable electrical parameters yet being less sensitive to process variation than existing devices.

A further object of the present invention is the production of an improved bipolar junction transistor which is especially resistant the degradation in electrical performance associated with dopant encroachment into the base region.

A further object of the present invention is the production of an improved bipolar junction-transistor emitter structure in which a layer of epitaxial silicon is selectively deposited on an exposed portion of the base region prior to deposition of the emitter polysilicon to form an "elevated" structure that reduces sensitivity to process variations.

A further object of the present invention is the use of the improved bipolar junction transistor in the production of an improved BiCMOS device through integration of BJT and CMOS processes, thereby allowing the benefits of the combination of BJT and CMOS structures in a single monolithic structure as well as the BJT performance improvements provided by the present invention.

SUMMARY

In the preferred embodiment, a PMOS field effect transistor and an NPN transistor each will be formed in respective N-wells with underlying N+ buried layers. An NMOS field effect transistor will be formed in a P-well. The NPN transistor will use the N-well as a collector with P-type dopant implanted into the N-well to form an intrinsic base region. A doped polysilicon layer forms contact regions for MOS sources and drains, as well as for the BJT collector and base.

Prior to diffusion of the dopant from the contact region polysilicon, the wafers are patterned and both the cap oxide and doped polysilicon are removed from the future CMOS gate and BJT emitter regions. An oxide layer, referred to here as a spacer oxide, is then formed on the vertical walls formed by the etch process to separate the doped polysilicon from the gate and emitter structures. The sidewall formation reduces the area of gate and emitter regions opened by the etch. To offset this reduction, the mask used to define the gate and emitter regions is sized to achieve the necessary final dimensions.

Gate oxide formed on the CMOS gate regions of the wafer insulate the gate contacts from their respective source and drain regions in the usual way. An epitaxial layer grown in the BJT emitter region elevates an n-type poly-emitter structure. This elevation structure separates the emitter from p-type dopant which would otherwise encroach from the heavily-doped polysilicon base contact. A layer of polysilicon (0.1–0.4 μm) is formed over the wafer, including gate and emitter regions and doped to form gate and emitter structures. The wafer is thermally processed to anneal the doped polysilicon structures. The remaining steps of the process sequence are not unique to the present invention, but they complete a functional device with multiple layers of metallic interconnection and a passivation layer.

DETAILED DESCRIPTION OF PREFERRED EMBODIMENTS

A BiCMOS circuit includes MOS and BJT devices. Devices may be positioned and interconnected in limitless ways on a monolithic structure to achieve the functions of the ultimate circuit application. The methods and structures of this invention are explained by showing the evolution of individual NMOS, PMOS and BJT devices during a fabrication process. It should be understood that this explanation is sufficient to enable persons of ordinary skill to fabricate monolithic circuits populated with many such devices as required for different applications. The absolute device dimensions, various circuit design criteria, doping methods, dopant concentrations, implantation conditions, and other process parameters may be varied to achieve devices with varying functions and performance levels. Values disclosed here are illustrative, but they are not absolute limits on the invention.

An object of the present invention is to obtain a single monolithic circuit structure which includes both CMOS devices and an elevated emitter BJT device with reduced sensitivity to extrinsic base region encroachment, and to do so with a minimum of additional process complexity. The above objective is achieved using the following fabrication approach.

BURIED LAYER AND WELL FORMATION:

In the preferred embodiment, an NMOS device will be formed in a P-well. A PMOS device and an NPN transistor each will be formed in respective N-wells with underlying N+ buried layers. A circuit designer may choose to add a buried layer under the P well or omit the buried layers under the N-wells while still taking advantage of the other methods and structures described below.

One method for preparing device regions begins with single crystal p-type silicon wafer, having a <100> crystallographic orientation and a resistivity of 5–30Ω-cm. Coating this wafer with a photoresist and patterning allows ion implantation of an n-type dopant, typically arsenic, $As^{75}$, $1.0 \times 10^{15}$–$4.0 \times 10^{16}$ atoms/cm$^2$ at 30–150 KeV, to form the buried layers. The photoresist exposes the regions which ultimately will underlie the N-wells (BJT and PMOS devices). Antimony, Sb, is an alternative n-type dopant for use in forming the N+ buried layer. In addition, a p+ buried layer is formed under the P-wells. Typically, implantation does this layer with either Boron or $BF_2$, $1.0 \times 10^{15}$–$4.0 \times 10^{16}$ atoms/cm$^2$, 5–90 Kev.

Figure 1:
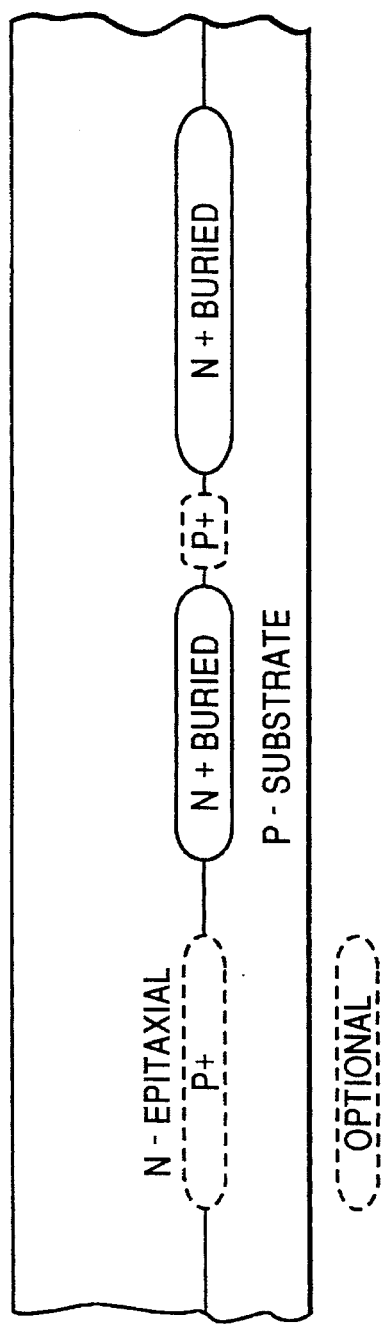
FIG. 1 is a three-device cross section showing buried N-layers for BJT and PMOS devices resulting from ion implantation followed by the growth of an epitaxial layer.

After photoresist removal, an n-type epitaxial ("epi") layer, typically 1.0–3.0 μm, with 5–30 Ω-cm resistivity, is grown over the p-type substrate and the N+ buried layers to form a wafer having a cross section as shown in FIG. 1.

Figure 2:
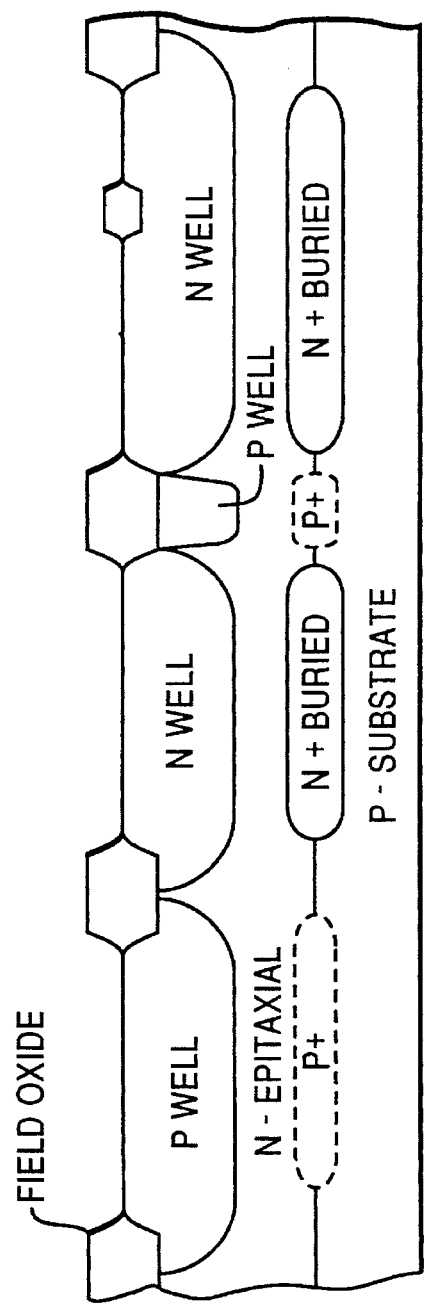
FIG. 2 is a three-device cross section showing wells for PMOS, NMOS and BJT devices resulting from ion implantation and diffusion steps, along with field oxides separating active regions.

FIG. 2 illustrates a three device cross section similar to FIG. 1 with additional P and N-wells. To fabricate this structure from the structure of FIG. 1, the wafer is coated with photoresist and patterned to expose the active areas for PMOS and BJT devices. Implantation dopes these active areas with phosphorus, $1.0 \times 10^{11}$–$8.0 \times 10^{13}$ atoms/cm$^2$, 30–150 KeV, or another n-type dopant. In PMOS areas, the n-type dopant sets the N-well doping. In the BJT regions the n-type dopant sets the collector doping.

After removing the N-well pattern, the wafer is coated with photoresist and patterned to expose the active areas for NMOS devices. Implantation dopes this active area with boron, $B^{11}$ or $BF_2$, $1.0 \times 10^{11}$–$8.0 \times 10^{13}$ atoms/cm$^2$, 20–100 KeV, or another p-type dopant. In NMOS areas the p-type dopant sets the P-well doping.

Although this explanation has described the implantation of the N-wells first, it should be understood that the P-wells and the N-wells may be implanted in either order.

It should also be understood that adjacent wells of the same dopant type may be more effectively isolated from one another by interspersing a region of the alternate dopant type. In the preferred embodiment this isolation is accomplished with a well implant mask that creates the region of alternate dopant type at the same time the alternate dopant type well is created. Similar isolation results may be achieved with one or more additional patterning and implant steps. FIG. 2 illustrates a p-type region having a P-well doping level formed between two adjacent N-wells. Similarly, n-type regions having an N-well doping level could be formed between adjacent P-wells during the N-well implant.

A layer of silicon dioxide ("oxide") 0.01–0.1 μm thick is formed on the wafer. A layer of silicon nitride ("nitride"), 0.05–0.3 μm thick, is then deposited on the oxide layer. The wafer is then coated with photoresist and patterned to protect the active device areas. The wafer is then etched to remove the nitride and oxide from the non-active "field" regions of the wafer. Depending on the process tolerances and requirements, a plasma etch or etches, a series of wet etches, or a combination of plasma and wet etches, may be used to remove the nitride and oxide layers.

After photoresist removal, the wafer is subjected to a long oxidation cycle during which field oxide, 0.3–1.2 μm, is formed in the field areas. Removal of the oxide and nitride that protected the active device areas exposes the n-type epi layer and results in a structure having a cross section as shown in FIG. 2.

BJT COLLECTOR CONTACT, BASE IMPLANTATION:

After the field oxidation cycle, the wafer is coated with photoresist and patterned to expose a deep collector contact region in the BJT N-well. Implantation increases the n-type dopant in the deep collector contact region. After removing the deep collector contact pattern, a thermal drive-in step, 950°–1150° C., 0.3–5.0 hours, in $N_2$, diffuses the N-well, P-well, and deep collector implants to a depth of 0.3–1.5 µm.

An alternative sequence includes an abbreviated 0 anneal/ thermal drive-in process prior to the deep collector pattern and implant. However, the well and deep collector thermal drive-ins may be combined for process simplicity.

Figure 3:
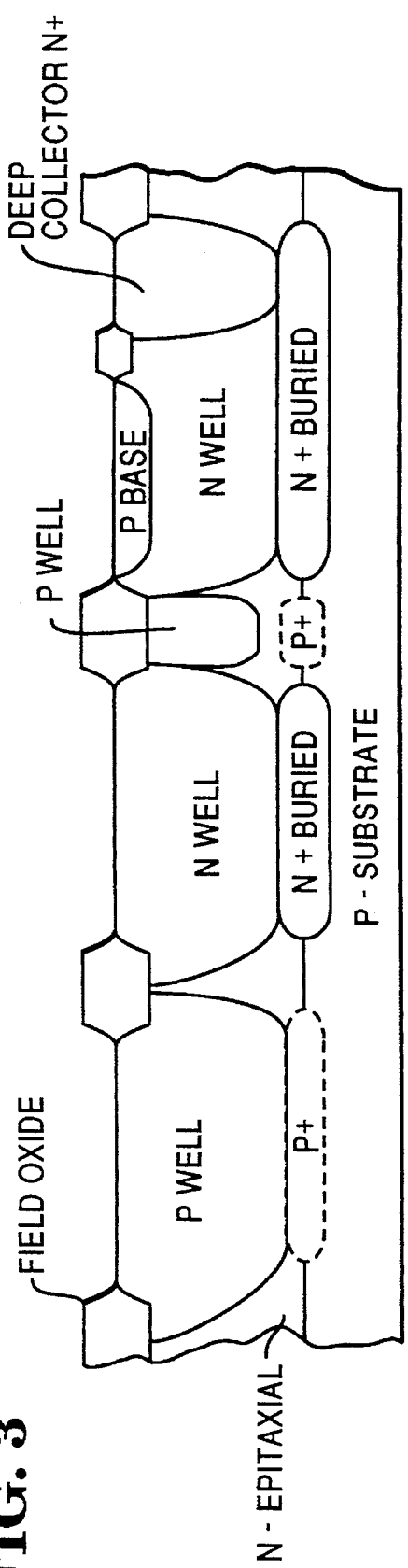
FIG. 3 is a three-device cross section showing a deep collector for the BJT device resulting from an ion implantation step and annealing step and an intrinsic base region.

The NPN transistor will use the N-well as a collector. A p-type dopant is implanted into the N-well to form an intrinsic base region. After the well/collector thermal processing, the wafer is coated again with photoresist and patterned to expose the base region for the BJT device. Implantation with a p-type dopant, $B^{11}$ or $BF_2$, $3.0\times10^{11}$–$1.0\times10^{14}$ atoms/cm$^2$, 5–100 KeV, offsets the N-well doping concentration and creates an intrinsic p-type base region. The result is shown in FIG. 3.

Throughout this disclosure, the term "intrinsic" is used in reference to relatively lightly doped semiconductor regions rather than regions which are completely undoped. Similarly, the term "extrinsic" is used in reference to semiconductor regions that are doped more heavily than the corresponding "intrinsic" regions. Used in this manner, neither term is intended to limit the absolute doping levels of the respective regions but should be used merely to distinguish the relative doping levels. It is to be understood that the absolute doping levels of the specified regions may be tailored to produce devices which, although they share a common structure, possess distinct electrical parameters.

POLY APPLICATION TO SOURCE, DRAIN, COLLECTOR AND BASE CONTACTS:

A polysilicon layer sets contact regions for MOS sources and drains, as well as for the BJT collector and base. After removing photoresist remaining after the base implantation step, a layer of polysilicon, 0.02–0.2 µm, is formed over the entire wafer. The wafer is then coated with photoresist and patterned to expose the extrinsic base and PMOS source and drain ("S/D") regions of the wafer. Implantation with boron, $B^{11}$ or $BF_2$, $1.0\times10^{15}$–$3.0\times10^{16}$ atoms/cm$^2$, 5–80 KeV, adds a p-type dopant to the polysilicon covering these areas. In an annealing step to be performed after forming an emitter structure (described below), the p-type dopant will diffuse into both the intrinsic base region of the BJT device and the N-well of the PMOS device, thereby producing an extrinsic base contact, as well as PMOS source and drain contacts. The annealing step that forms the base and PMOS contact regions may also be performed after the doped poly has been removed from the gate and emitter regions but prior to completion of the emitter structure.

After removing photoresist remaining after the p-type implantation step, the wafer is coated with photoresist and patterned to expose the BJT collector region and the NMOS S/D regions. Implantation with arsenic, $As^{75}$, $1.0\times10^{15}$–$3.0\times10^{16}$ atoms/cm$^2$, 30–150 KeV, adds an n-type dopant to these areas. In an annealing step to be performed after forming an emitter structure (described below), the n-type dopant will diffuse into both the deep collector region of the BJT device and the P-well of the NMOS device, thereby producing an extrinsic collector contact, as well as NMOS source and drain contacts. Although this explanation has described the implantation of the p-type dopant first, it should be understood that the p-type dopant and the n-type dopant may be implanted in either order.

Figure 4:
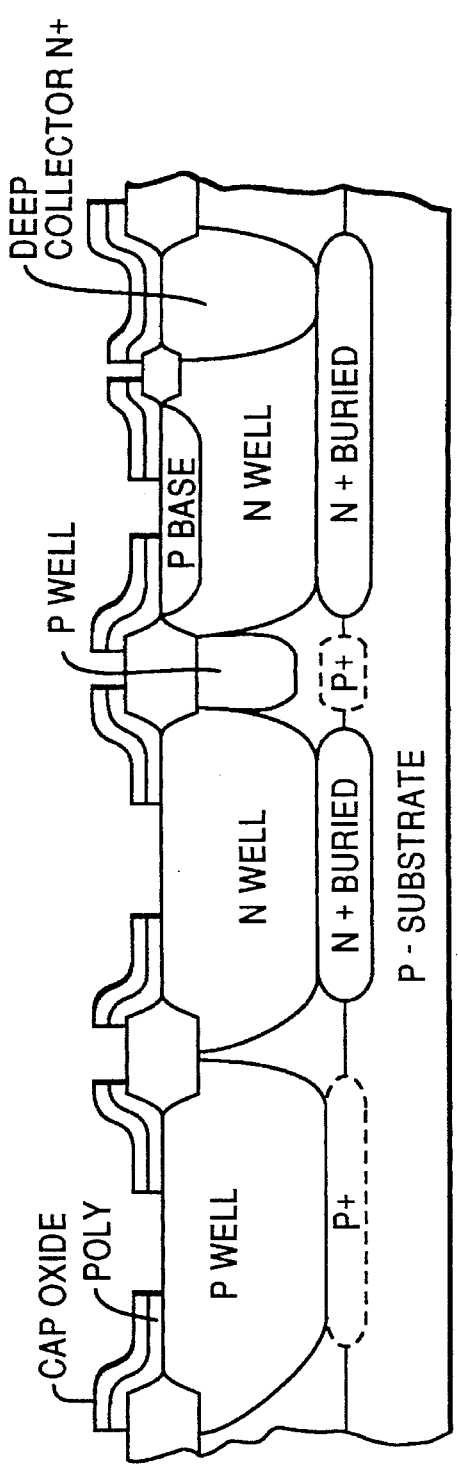
FIG. 4 is a three-device cross section showing polysilicon contact regions and cap oxides for the source, drain, base and collector following deposition, implantation and etching steps.

After removing photoresist remaining after polysilicon contact implantation, an oxide layer, 0.05–0.5 µm, referred to as the "cap oxide," is formed on the wafer. The wafer is then coated with photoresist and patterned to expose the CMOS gate and BJT emitter regions of the wafer. Etching removes the cap oxide and polysilicon layers from the CMOS gate and BJT emitter regions to produce a structure having a cross section as shown in FIG. 4.

SPACER OXIDE AND GATE OXIDE FORMATION:

Two sets of oxides are applied to the wafer at this stage, each to perform different functions. Spacer oxides formed along the vertical walls etched into the polysilicon/cap oxide layers narrow the widths of the (yet to be formed) gate and emitter structures. These spacer oxides set the boundaries of the gate and emitter structures at a positions displaced away from the heavily-doped polysilicon contact regions. This physical displacement provides a measure of protection against the device performance degradation associated with dopant encroachment from the contact regions into the intrinsic base and CMOS gate regions during the later annealing steps.

By contrast, the gate oxide formed on the wafer between the MOS source and drain regions insulates the polysilicon gate structures (yet to be formed) from the respective S/D channels in the usual manner.

Figure 5:
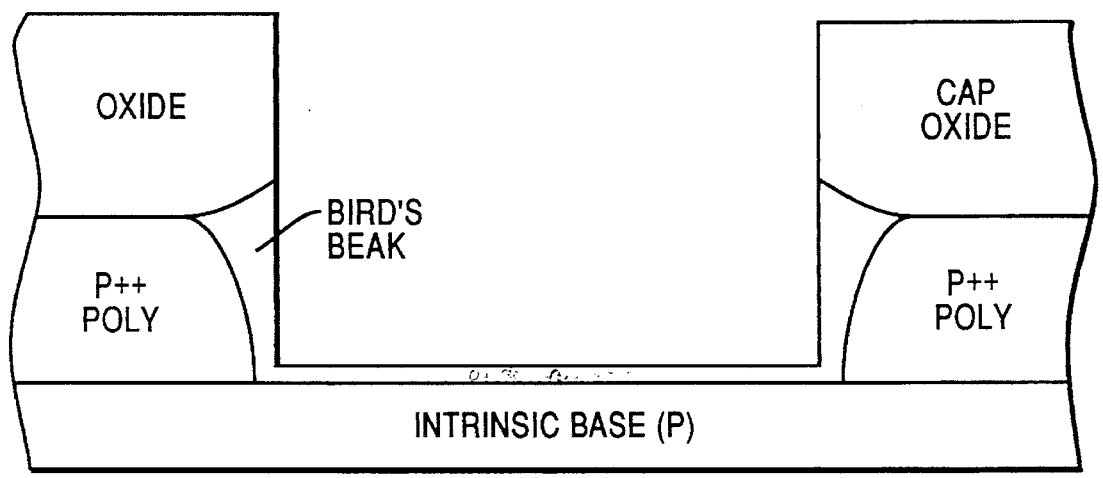
FIG. 5 is a detail cross section of the BJT emitter region showing "bird's-beak" oxidation at the base-poly corner.

Formation of the spacer oxides begins with an oxidation process under conditions which produce enhanced oxygen diffusion and oxide formation along the cap-oxide/polysilicon interface resulting in a characteristic oxide structure known as a "bird's beak." As illustrated in FIG. 5, oxidation consumes the polysilicon "corner" more rapidly than interior polysilicon layer and produces a structure with distinctly rounded edges. By increasing minimum thickness of the oxide layer on the extrinsic polysilicon, the formation of the "bird's beak" improves the process tolerance for overetching during the spacer etch step. This increased thickness helps maintain desirable breakdown voltage characteristics (measured between the BJT base and the BJT emitter) of the resulting device.

Figure 6:
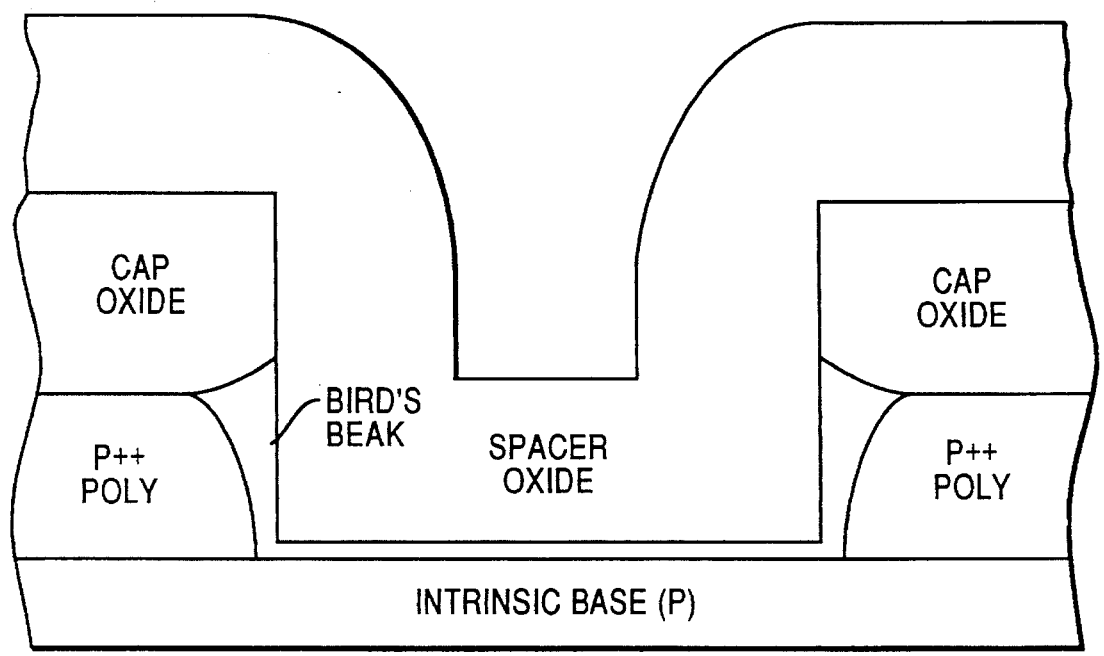
FIG. 6 is a detail cross section of the BJT emitter region showing spacer oxide before etching.

At the completion of this "round-corner" oxidation, a layer of oxide, 0.1–0.4 µm, is deposited on the wafer. This oxide layer covers the exposed intrinsic base area of the emitter region as shown in FIG. 6. Partial removal of the oxide layer leaves the desired spacer oxide structures on the vertical walls adjacent to the polysilicon/cap oxide structure, as illustrated in FIG. 7.

Figure 7:
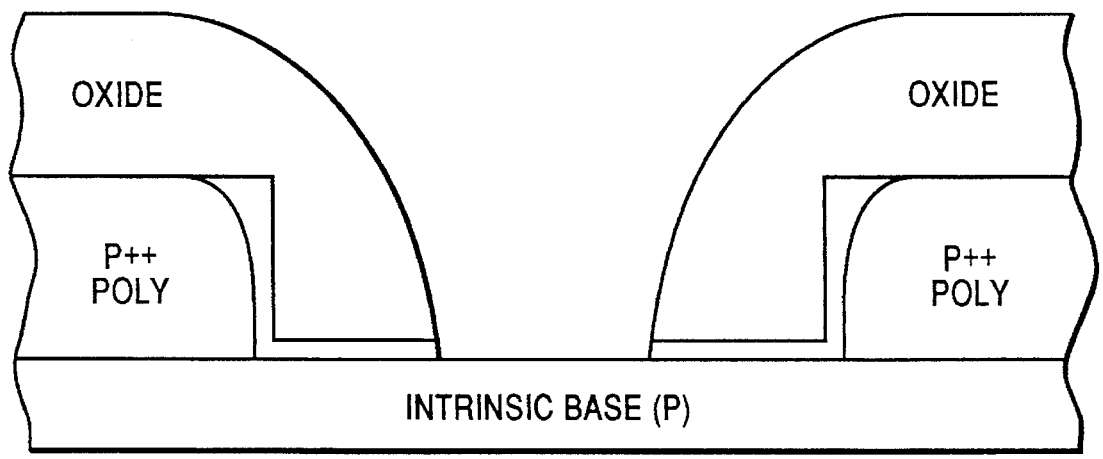
FIG. 7 is a detail cross section of the BJT emitter region showing spacer oxide after etching.
Figure 8:
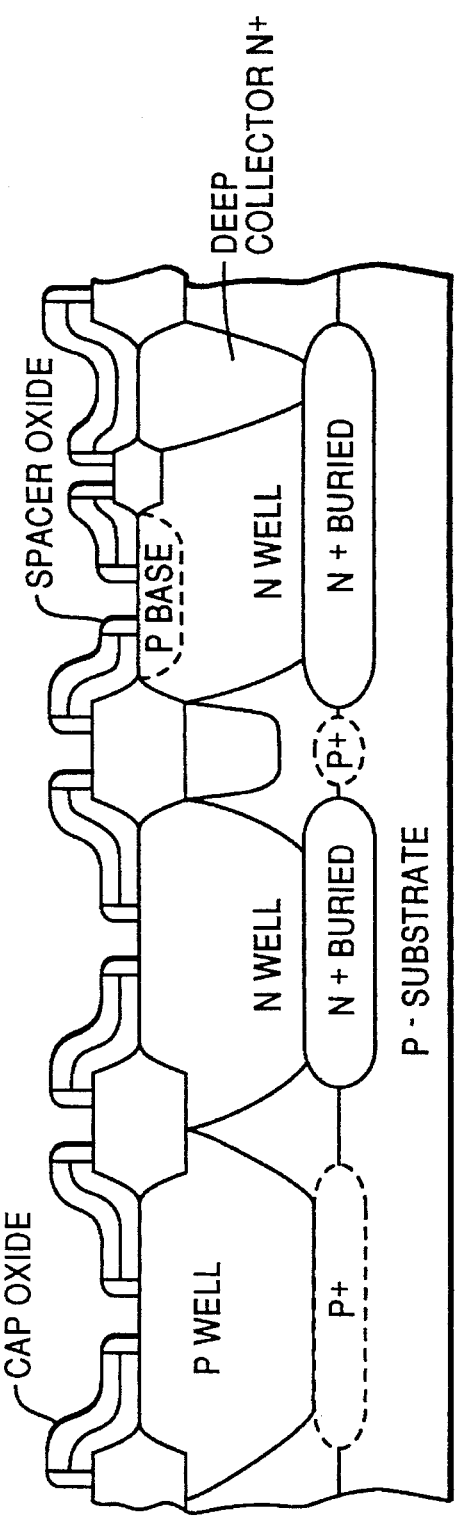
FIG. 8 is a three device cross section showing spacer oxide after etching.

FIGS. 5–7 have illustrated the formation of spacer oxides in the emitter region. Spacer oxides also form in the same manner at other vertical walls etched into the polysilicon, such as in the gate regions. The result is an overall structure having a cross section as shown in FIG. 8.

The spacer oxides formed in the MOS device regions define the dimensions of the MOS gate region. Gate oxide, 0.005–0.05 µm, is then grown in the MOS gate regions. A thin layer of polysilicon, 0.02–0.2 µm, is then deposited on the wafer.

Figure 9:
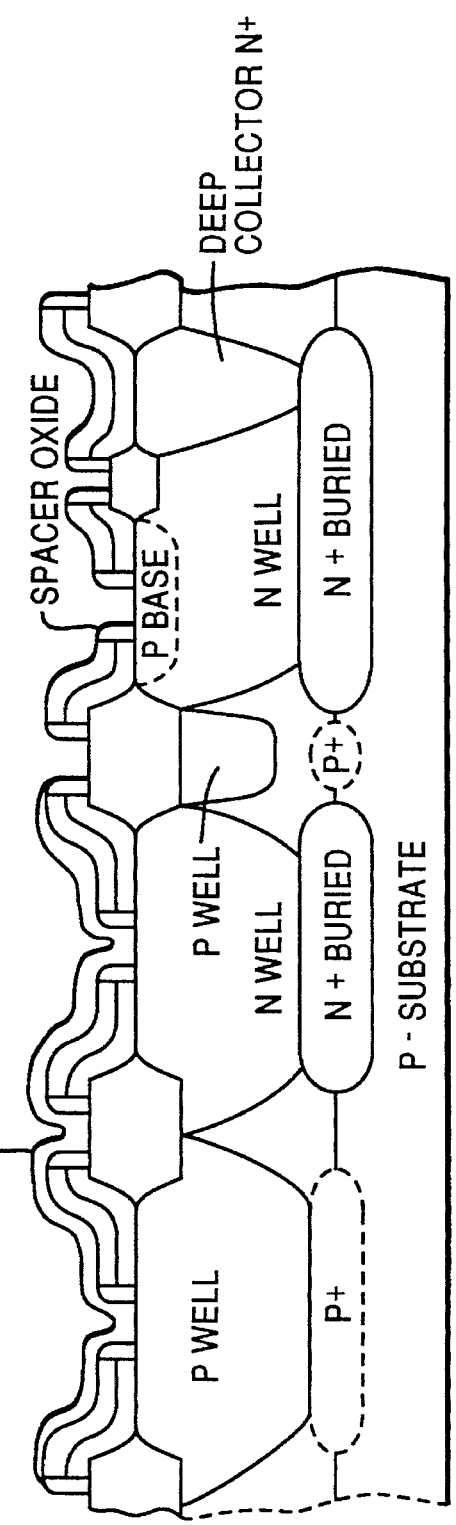
FIG. 9 is a three device cross section showing FET gate oxides covered by a thin polysilicon layer after deposition and etching.

Rather than completing the MOS gate structures at this point, steps are taken to form the elevated emitter structure. The wafer is coated with photoresist and patterned to define the BJT emitter regions. The wafer is then etched to remove the polysilicon and gate oxide layers from the emitter regions to produce an intermediate structure as shown in FIG. 9.

ELEVATED EMITTER FORMATION:

After removing photoresist remaining after the emitter etching step, a second epitaxial silicon layer, typically p-type, 0.1–0.2 µm thick, and having a resistivity of 1–15

Figure 10:
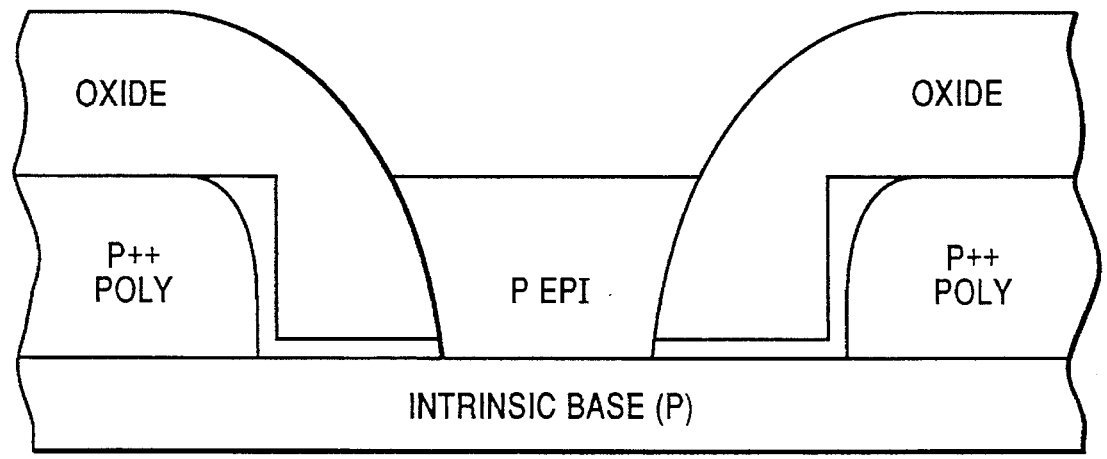
FIG. 10 is a detail cross section of the BJT emitter region showing an epitaxial emitter elevation structure resulting from growth and implantation and etch steps.

Ω-cm, is formed in the BJT emitter region. As illustrated in FIG. 10, the spacer oxides on the vertical walls along the BJT base contacts will position the lateral edges of the elevated emitter structure.

The epitaxial layer is formed by a process of chemical vapor deposition ("CVD") in which the gas phase of a silicon compound decomposes and deposits elemental silicon on the surface of a heated wafer. The epitaxial silicon layer is unique in that the process conditions are such that the silicon deposited on the wafer surface maintains the same crystallographic orientation as the substrate wafer, thereby extending the underlying single crystal structure. A selected dopant may be introduced during the epitaxial deposition to produce a generally uniformly doped single crystal layer. The doping in the epitaxial layer may be of an opposite type to that of the underlying substrate, of a similar type but with a distinctly different doping level, or, as in the present process, of the same type and with very similar doping levels, depending on the process requirements.

In the present method, the second epitaxial layer is used to produce the elevated emitter structure. Although the first epitaxial layer was formed on the entire wafer surface, the second epitaxial layer is selectively formed only on the exposed silicon present in the BJT emitter region of the wafer. Under the process conditions used in the present invention, the oxide layer remaining in the field isolation, and non-emitter BJT regions prevents epitaxial formation in locations other than the BJT emitter regions. During deposition, the epitaxial layer is lightly doped with a p-type dopant, thereby making the epitaxial layer an extension of the intrinsic base region of the BJT transistor.

It should be understood that this epitaxial layer, by building up and extending the intrinsic base region, will elevate the (yet to be formed) poly-emitter. As will be shown in more detail below, p-type dopant will diffuse from the heavily-doped extrinsic base contact region during annealing. The elevation of the poly-emitter increases the travel distance between the emitter and base contacts without a corresponding increase in the horizontal dimension of the BJT device. In other words, the elevation of the poly-emitter increases the process tolerance to encroachment from the extrinsic regions, thereby allowing a device produced by the present method to avoid the performance degradation endured by a prior art device of similar horizontal dimensions. In a manufacturing environment, this increased process tolerance may be translated into higher device densities or improved process yields.

COMPLETION OF POLY APPLICATION TO GATE AND EMITTER CONTACTS:

After forming the epitaxial layer between spacer oxides in the emitter region, a layer of polysilicon, 0.1–0.4 μm, is formed over the wafer, including gate and emitter regions, which will be doped to form gate and emitter structures. Implantation, using arsenic, (or an As/P combination) $As^{75}$, $5.0 \times 10^{15}$–$5.0 \times 10^{16}$ atoms/cm$^2$, 30–150 KeV, dopes both the CMOS gates and the BJT emitter with an n-type dopant to reduce the resistivity of the deposited polysilicon. FIG. 10 shows the resulting emitter structure.

Figure 11:
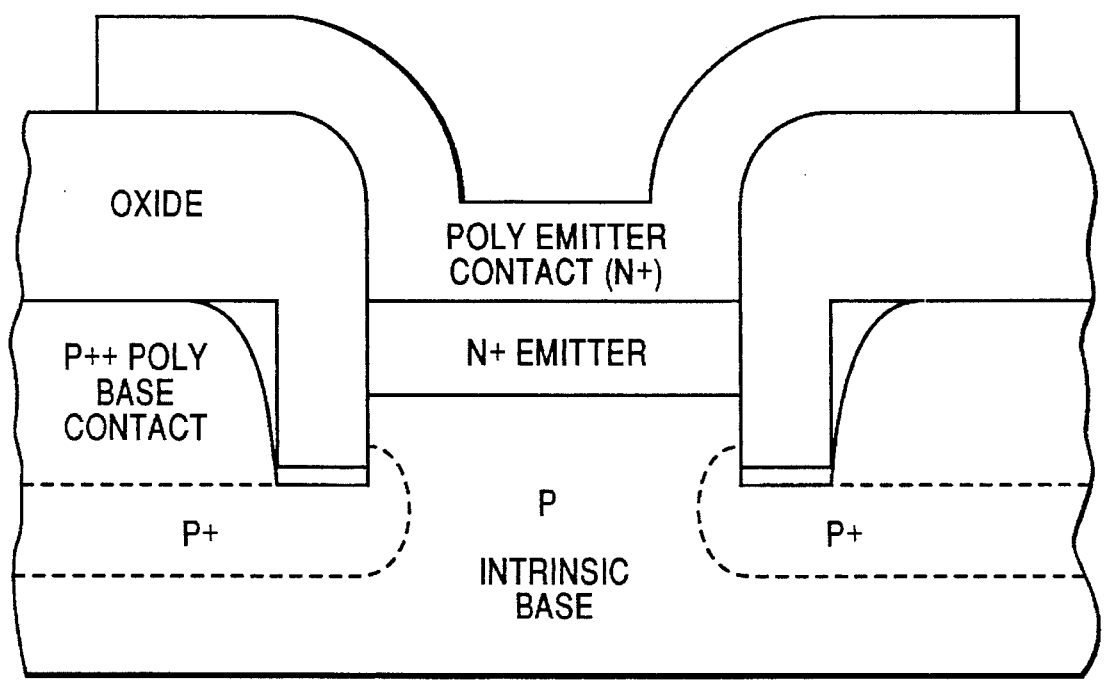
FIG. 11 is a detail cross section of the BJT emitter region showing an elevated emitter separated from encroachment, as well as a polysilicon emitter contact.

The wafer is thermally processed to anneal the implanted polysilicon, 900°–1000° C., 0 3–3.0 hours and if desired to grow a thin, 0.01–0.1 μm, oxide layer. Annealing causes p-type dopant to diffuse from the heavily-doped base contact layer into the intrinsic base region to form an extrinsic base contact as illustrated in FIG. 11. It will be appreciated that the spacer oxide displaces the emitter structure from the base contact layer and thereby protects against device performance degradation associated with encroachment. It will also be appreciated that the epitaxial layer formed above the intrinsic base elevates the emitter. The additional travel distance through this elevation structure provides an additional measure of protection against device performance degradation associated with encroachment. It will also be appreciated that the "birds-beak" oxidation effect increases the thickness of the oxide between the emitter and base structures, thereby maintaining desirable breakdown characteristics over a wider range of process variations and increasing the electrical integrity of the resulting device.

Figure 12:
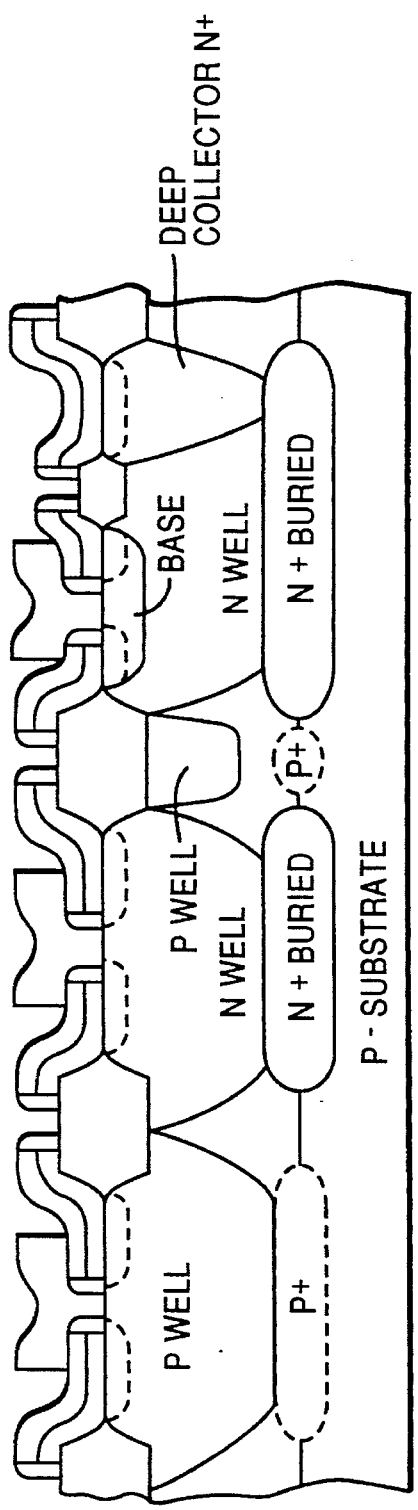
FIG. 12 is a three-device cross section showing gate and emitter structures, as well as extrinsic source, drain and base contact regions after annealing.

After the thermal anneal process, the wafer is coated with photoresist and patterned to protect the CMOS gate and the BJT emitter regions. The wafer is then etched to remove the exposed polysilicon layer, thereby defining both MOS gate poly and BJT emitter poly structures. The resulting structure is shown in FIG. 12.

BPSG DEPOSITION AND METAL CONTACT APPLICATION:

The remaining steps of the process are not unique to the present invention but may be used to produce a functional device with multiple layers of metallic interconnection and a passivation layer. One exemplary process is described here.

After removing photoresist remaining after etching, a layer of borophosphosilicate glass ("BPSG"), 0.6–1.0 μm, is deposited on the wafer. The BPSG layer is then subjected to a thermal "reflow" process, 800°–950° C., 10–90 minutes to improve wafer planarization. The wafer is then coated with photoresist and patterned to expose openings to the CMOS S/D, CMOS gate, BJT emitter, BJT base contact, and BJT collector contact regions. Etching removes the BPSG from the contact openings.

Figure 13:
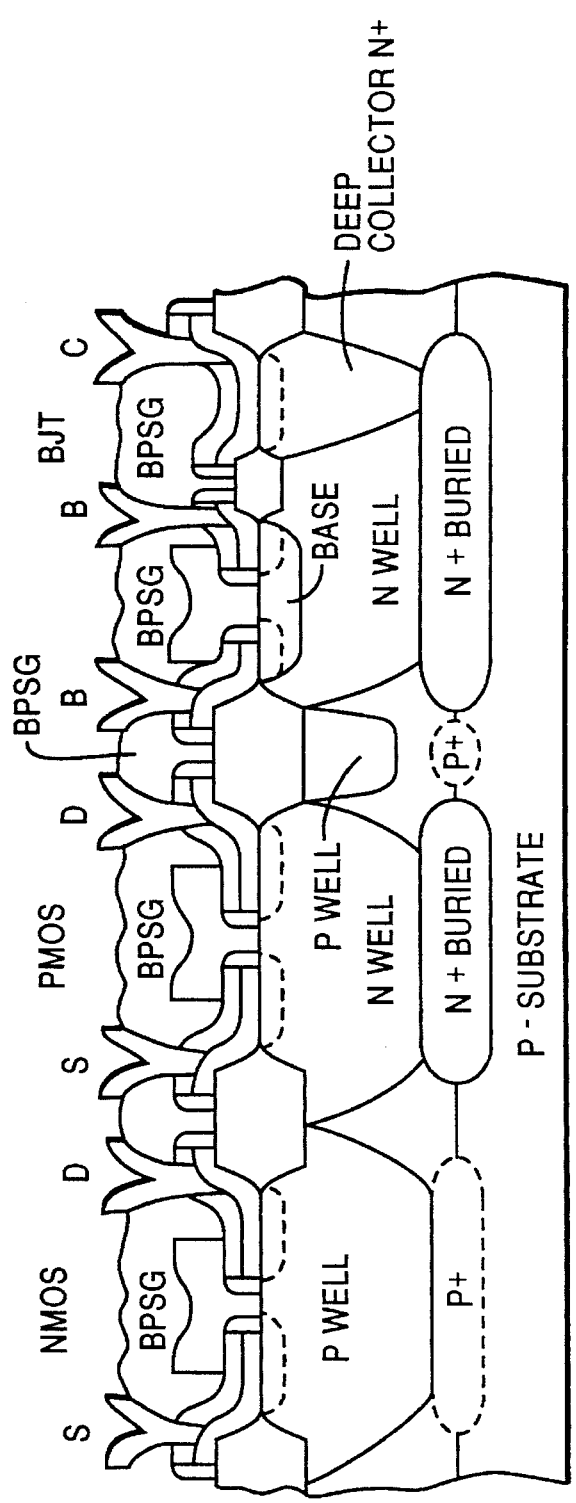
FIG. 13 is a three-device cross section showing a glass layer etched to expose contact regions and metal contacts to source, drain, base and collector regions.
Figure 14:
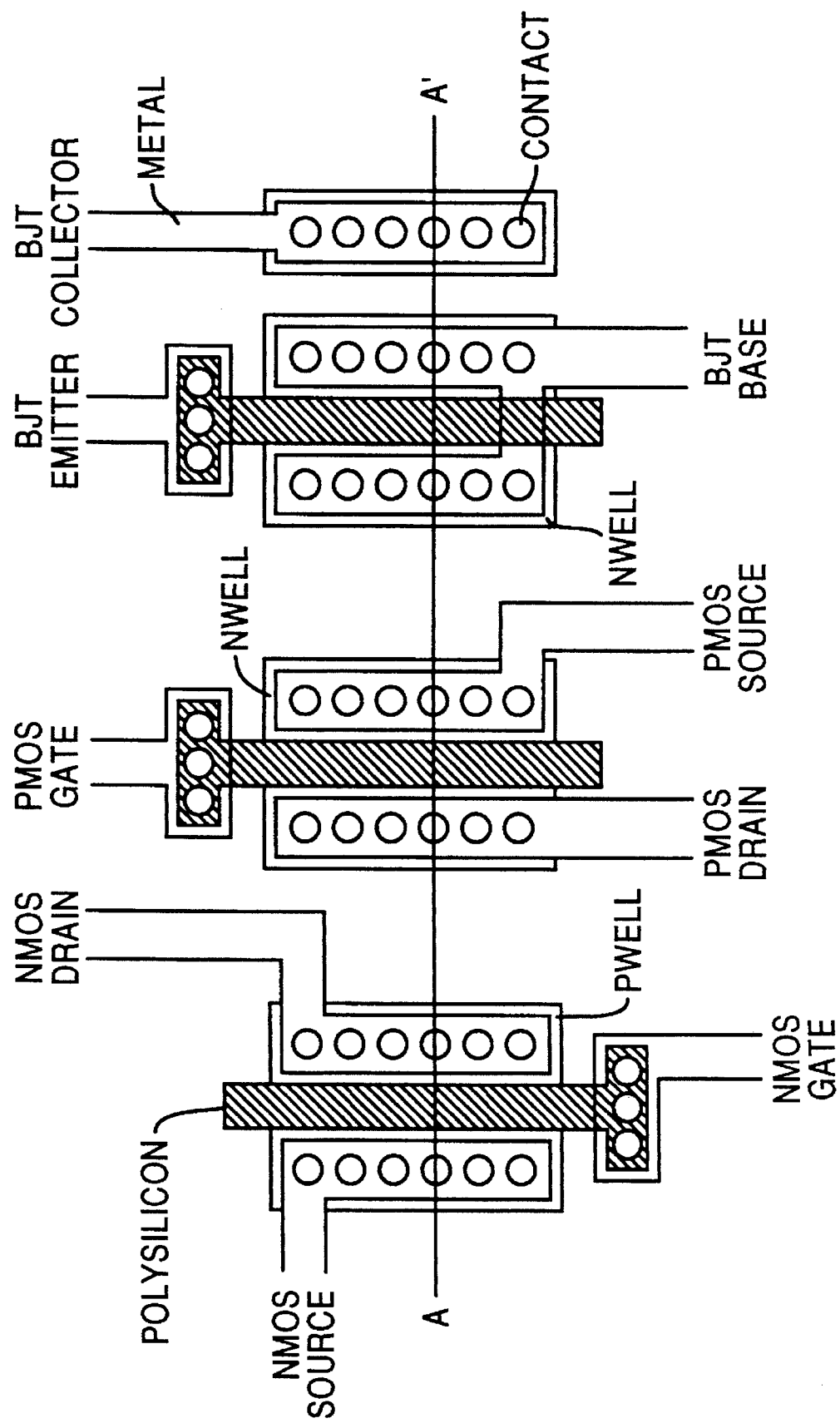
FIG. 14 is a top view of the three-device structure of FIG. 13 showing the contact regions and metal leads of the CMOS and BJT devices with the cross section of FIG. 13 indicated by the line A–A'.

After removing photoresist remaining after the etching process, a first layer of metal, typically an Al—Si—Cu alloy, 0.5–1.2 μm, is formed on the wafer using sputter deposition. The wafer is coated with photoresist and patterned to protect a first level of metal leads. The wafer is then etched to remove that portion of the metal not protected by the photoresist pattern, leaving a structure as shown in FIG. 13.

After removing photoresist remaining after the etching step, a layer of oxide, 0.6–1.5 μm, is deposited on the wafer. The wafer is coated with photoresist and patterned to expose a first level of via openings to the first metal layer. Etching removes the oxide from the defined first level via openings.

Additional metal layers may be added as required using known techniques. It is contemplated that three layers would provide adequate interconnection for many applications.

A passivation layer of nitride, oxynitride, or a compound layer of phosphorus doped oxide and nitride, 0.5–2.0 μm, is formed on the wafer. The wafer is then sintered in a forming gas ambient at 380°–450° C. for 30–90 minutes to form an alloy at the contact metal/silicon interface, thereby providing good electrical connection between the metal and the silicon substrate. The wafer is then coated with photoresist and patterned to define wire bonding openings in the passivation layer. The wafer is then etched to remove the exposed passivation material.

After removal of the remaining photoresist the wafer is ready for pre-assembly testing.

What is claimed is:

1. A method for forming an elevated emitter structure in a monolithic device comprising steps of:

at least partially forming transistor structures on a substrate, including field oxide structures defining a first well region in the substrate for a bipolar transistor and a second well region in the substrate for a field effect transistor;

forming a base in the first well region, said base having an upper surface;

forming a base contact region at least partially above the base;

forming an elevation structure in contact with a portion of the base upper surface and not in contact with the base contact region; and forming an elevated emitter in contact with the elevation structure so as to separate the elevated emitter from the base contact region.

2. The method of claim 1 further comprising the step of annealing the base, the base contact region, the elevation structure, and the elevated emitter.

3. A method as in claim 1 wherein the step of forming an elevation structure includes a step of forming a silicon layer over at least a portion of the base.

4. A method as in claim 1 wherein the step of forming an elevation structure includes a step of forming a silicon layer doped with the same dopant type as the base.

5. A method as in claim 1 wherein the step of forming an elevation structure includes steps of:

forming a spacer adjacent to the base contact region and above a portion of the base; and forming a silicon layer in contact with the base and with the spacer.

6. A method as in claim 1 wherein the step of forming an emitter includes a step of applying a semiconductor layer of a different dopant type than the elevation structure.

7. A monolithic semiconductor device comprising:

field oxide structures defining a first well region for a bipolar transistor and a second well region for a field effect transistor;

a base in the first well region and having an intrinsic concentration of a first dopant type, the base including an extrinsic region underlying a semiconductor contact, said extrinsic region characterized by a concentration of the first dopant type which is greater than the intrinsic concentration;

an elevation structure attached to the base at a portion of said base separate from said extrinsic region, said elevation structure extending from a plane generally defined by an external surface of said base to a surface above said base;

an emitter of a second dopant type connected to the elevation structure at the surface above the base;

a field effect transistor including a source and a drain in the second well region; and a metal layer, separate portions of which individually connecting to each of said base, emitter, collector, source and drain.

8. A device as in claim 7 further comprising a spacer separating the semiconductor contact from the elevation structure.

9. A bipolar PN junction device comprising:

a first semiconductor having a substantially planar surface and containing an intrinsic concentration of a first dopant type, the first semiconductor also including an extrinsic region underlying a semiconductor contact disposed above the planar surface, said extrinsic region characterized by a concentration of the first dopant type which is greater than the intrinsic concentration;

an elevation structure disposed above the planar surface at a portion of said first semiconductor separate from said extrinsic region, said elevation structure having an upper surface; and a second semiconductor of a second dopant type connected to the elevation structure upper surface.

10. A device as in claim 9 further comprising a spacer separating the semiconductor contact from the elevation structure.

11. A method as in claim 5 further including steps of:

forming an oxide layer over the silicon layer; and forming a bird's beak over the base between the oxide and silicon layers.

12. A device as in claim 7 further comprising:

a base contact of the second dopant type attached to the base and having a bird's beak at a surface displayed from the base.

13. A method for forming a bipolar and complementary MOS devices, comprising the steps of:

forming a p-well, and first and second n-wells, within a semiconductor substrate having an upper surface;

forming a deep collector region within the second n-well;

forming a lightly doped p-type intrinsic base region within the second n-well;

forming a first polysilicon layer on the substrate upper surface over portions of the p-well and first and second n-wells, wherein the polysilicon layer over the first and second n-wells is heavily doped p-type, and over the p-well is heavily doped n-type, and wherein gate regions are left exposed in the p-well and first n-well, wherein a first portion of the intrinsic base region is left exposed in the second n-well, and wherein the first polysilicon layer has an oxide layer on a top and sidewalls thereof;

growing a gate oxide layer on exposed surfaces of the substrate on the gate regions and exposed first portion of the intrinsic base region;

depositing a second polysilicon layer over the first oxide layer and the gate oxide layer;

removing the gate oxide and second polysilicon layers from over the first portion of the intrinsic base region;

selectively growing an epitaxial region on the first portion of the intrinsic base region, wherein the epitaxial region extends above the substrate upper surface and has the same doping level as the intrinsic base region;

forming a second polysilicon layer over an upper surface of the epitaxial region and over the deep collector region, wherein the second polysilicon layer is heavily doped n-type; and thermally annealing the device, wherein a collector contact is formed over the deep collector region, an emitter is formed in an upper portion of the epitaxial region, extrinsic base regions are formed within the intrinsic base region in the portions of the second n-well covered by the first polysilicon layer, and source/drain regions are formed in the p-well and first n-well in portions thereof covered by the first polysilicon layer.

14. The method of claim 13, further comprising the step of:

patterning the second polysilicon layer to define gates over the p-well and first n-well, and an emitter polysilicon structure over the emitter.

15. The method of claim 13, wherein the step of forming the first polysilicon layer comprises the steps of:

forming a polysilicon layer over the substrate upper surface;

implanting portions of the first polysilicon layer overlying the p-well and the deep collector region with an n-type dopant;

implanting portions of the first polysilicon layer overlying the first n-well and the extrinsic base region with a p-type dopant; and removing the polysilicon layer over portions of the p-well and the first n-well to define the gate regions, and over a portion of the intrinsic base region to define the intrinsic base region first portion.

16. The method of claim 15, further comprising the steps of:

before the removing step, depositing an overlying oxide layer over the polysilicon layer.

17. The method of claim 16, further comprising the step of:

after the removing step, forming oxide alongside sidewalls of the polysilicon layer and the overlying oxide layer.

18. The method of claim 13, wherein the step of selectively growing the epitaxial region comprises the step of growing the epitaxial region while introducing a p-type dopant.

19. The method of claim 13, wherein the step of forming the second polysilicon layer comprises the steps of:

depositing an undoped layer of polysilicon; and implanting n-type dopant into the undoped layer of polysilicon.

20. A method for forming a vertical bipolar junction transistor having an elevated emitter, comprising the steps of:

providing a substrate having an upper surface, and a region having a first conductivity type;

forming a highly doped deep collector region having the first conductivity type;

forming an intrinsic base region within the substrate adjacent to the upper surface, the intrinsic base being lightly doped with a second conductivity type;

forming a highly doped base contact polysilicon structure, having the second conductivity type, on the upper surface and covering a first portion of the intrinsic base region, leaving a second portion thereof exposed, wherein the highly doped base contact structure further has an oxide layer on a top surface and sidewalls thereof;

selectively growing an epitaxial region on the substrate upper surface, on the second portion of the intrinsic base region, wherein the epitaxial region has the same doping as the intrinsic base region;

forming a highly doped, with the first conductivity type, emitter polysilicon structure on the epitaxial region; and performing a thermal anneal to form an emitter region in upper portions of the epitaxial region in contact with the emitter polysilicon structure, and to form extrinsic base regions, within the intrinsic base region, in portions of the intrinsic base region in contact with the base contact polysilicon structures.

21. The method of claim 20, wherein the first conductivity type is n-type, and the second conductivity type is p-type.

22. The method of claim 20, wherein, as a result of the thermal anneal step, the extrinsic base regions extend under the oxide layer on the sides of the base contact polysilicon structure.

23. The method of claim 20, further comprising the step of:

when the emitter polysilicon structure is formed, simultaneously forming a collector polysilicon contact structure over and in contact with the deep collector region.

24. The method of claim 20, wherein the step of forming the base polysilicon contact structure comprises the steps of:

depositing a polysilicon layer;

implanting the polysilicon layer with a p-type dopant; and etching the polysilicon layer to define the base polysilicon contact structure.

25. The method of claim 24, further comprising the step of:

before the etching step, forming an overlying oxide layer over the polysilicon layer.

26. The method of claim 25, further comprising the step of:

after the etching step, forming oxide alongside sidewalls of the polysilicon layer.

27. A bipolar junction transistor structure having a raised emitter region, comprising:

a substrate having a planar upper surface and a first conductivity type;

a collector region within the substrate, wherein the collector region is highly doped with the first conductivity type;

an intrinsic base region within the substrate, wherein the intrinsic base region is lightly doped with a second conductivity type;

a highly doped extrinsic base region within the intrinsic base region, wherein the extrinsic base region has the second conductivity type;

a polysilicon base contact structure lying on the upper surface in contact with the extrinsic base region, wherein the base polysilicon contact structure has the second conductivity type;

an oxide layer on the base polysilicon contact structure, covering an upper surface and vertical sidewalls thereof;

an epitaxial region on a portion of the substrate upper surface and in contact with the intrinsic base region, wherein the epitaxial region has the second conductivity type and a doping level the same as the intrinsic base region;

an emitter region in an upper portion of the epitaxial region and spaced from the substrate upper surface, the emitter region having the first conductivity type; and an emitter polysilicon contact structure on the emitter region, the emitter polysilicon contact having the first conductivity type.

28. The structure of claim 27, wherein the first conductivity type is n-type, and the second conductivity type is p-type.

29. The structure of claim 27, wherein the extrinsic base region extends under a portion of the oxide layer on the vertical sidewall of the base polysilicon contact structure.

30. The structure of claim 27, wherein the extrinsic base region extends under the oxide layer on the vertical sidewall of the base polysilicon contact structure, and under a portion of the epitaxial region.

31. The structure of claim 27, wherein the extrinsic base region extends under the oxide layer on the vertical sidewall of the base polysilicon contact structure, under a portion of the epitaxial region, and into a portion of the epitaxial region above the substrate upper surface.

* * * * *